United States Patent
Cader et al.

(10) Patent No.: US 10,433,458 B1
(45) Date of Patent: Oct. 1, 2019

(54) CONDUCTING PLASTIC COLD PLATES

(71) Applicant: Hewlett Packard Enterprise Development LP, Houston, TX (US)

(72) Inventors: Tahir Cader, Liberty Lake, WA (US); Harvey Lunsman, Chippewa Falls, WI (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/973,705

(22) Filed: May 8, 2018

(51) Int. Cl.
| | |
|---|---|
| H05K 7/20 | (2006.01) |
| H01L 23/473 | (2006.01) |
| H01L 23/427 | (2006.01) |
| G06F 1/20 | (2006.01) |
| F28F 3/04 | (2006.01) |
| F28F 21/06 | (2006.01) |
| F28D 15/02 | (2006.01) |

(52) U.S. Cl.
CPC ..... *H05K 7/20254* (2013.01); *F28D 15/0233* (2013.01); *F28F 3/04* (2013.01); *F28F 21/065* (2013.01); *G06F 1/20* (2013.01); *H01L 23/473* (2013.01); *H05K 7/20336* (2013.01); *G06F 2200/201* (2013.01); *H01L 23/427* (2013.01)

(58) Field of Classification Search
CPC .......... H05K 7/20636; H05K 7/20672; H05K 7/20772; H05K 7/20809
See application file for complete search history.

(56) References Cited

U.S. PATENT DOCUMENTS

| | | | |
|---|---|---|---|
| 5,050,037 A | 9/1991 | Yamamoto et al. | |
| 5,245,508 A | 9/1993 | Mizzi | |
| 5,413,167 A * | 5/1995 | Hara | G03F 7/707 165/104.33 |
| 5,453,911 A | 9/1995 | Wolgemuth et al. | |
| 6,989,991 B2 * | 1/2006 | Barson | H01L 23/473 165/80.4 |
| 7,092,255 B2 | 8/2006 | Barson et al. | |
| 7,240,722 B2 * | 7/2007 | Lai | F28F 3/12 165/104.21 |
| 7,450,387 B2 | 11/2008 | Cheng et al. | |

(Continued)

FOREIGN PATENT DOCUMENTS

| | | | |
|---|---|---|---|
| CN | 104932648 A | * | 9/2015 |
| CN | 204925954 U | * | 12/2015 |

(Continued)

OTHER PUBLICATIONS

Oshman, Christopher et al., "The Development of Polymer-Based Flat Heat Pipes", Journal of Microelectromechanical Systems, vol. 20, No. 2, Apr. 2011, pp. 410-417. (Year: 2011).*

(Continued)

*Primary Examiner* — Robert J Hoffberg
(74) *Attorney, Agent, or Firm* — Brooks, Cameron & Huebsch, PLLC

(57) ABSTRACT

Cold plates are described herein. In one example, a cold plate can include a thermally conductive plastic forming a coolant channel that includes a heat spreader formed into the thermally conductive plastic and an exterior surface of the thermally conductive plastic with a coupling location to couple a heat pipe to the exterior surface of the thermally conductive plastic.

14 Claims, 6 Drawing Sheets

(56) References Cited

U.S. PATENT DOCUMENTS

| | | | |
|---|---|---|---|
| 7,626,820 B1 * | 12/2009 | Konshak | H05K 7/20672 165/104.33 |
| 7,719,839 B2 * | 5/2010 | Hoss | H01L 23/34 165/80.3 |
| 8,004,841 B2 * | 8/2011 | Cipolla | F28D 15/0233 165/104.33 |
| 8,081,473 B2 * | 12/2011 | Cipolla | H01L 23/4093 165/104.33 |
| 8,286,693 B2 * | 10/2012 | Whitney | B21D 53/02 165/104.21 |
| 8,358,505 B2 | 1/2013 | Toftloekke et al. | |
| 8,505,616 B2 | 8/2013 | Behrens et al. | |
| 8,638,559 B2 * | 1/2014 | Barina | H01L 23/4093 165/104.21 |
| 9,230,726 B1 | 1/2016 | Parker et al. | |
| 9,307,674 B2 * | 4/2016 | Chainer | H05K 7/20772 |
| 9,332,676 B2 | 5/2016 | Sharaf et al. | |
| 9,414,523 B2 * | 8/2016 | Chainer | H05K 7/20772 |
| 9,686,887 B2 | 6/2017 | D'Onofrio | |
| 9,930,806 B2 * | 3/2018 | Chainer | H05K 7/20772 |
| 9,930,807 B2 * | 3/2018 | Chainer | H05K 7/20772 |
| 9,936,607 B2 * | 4/2018 | Chainer | H05K 7/20772 |
| 10,045,463 B2 * | 8/2018 | Chainer | H05K 7/20772 |
| 2003/0042005 A1 * | 3/2003 | Sagal | F28D 15/0233 165/80.3 |
| 2003/0057546 A1 * | 3/2003 | Memory | H05K 7/20681 257/706 |
| 2007/0204646 A1 * | 9/2007 | Gagliano | F28D 15/0233 62/389 |
| 2009/0225515 A1 * | 9/2009 | Hom | H05K 7/20781 361/701 |
| 2010/0000720 A1 * | 1/2010 | Li | G06F 1/20 165/104.33 |
| 2013/0168068 A1 * | 7/2013 | Huang | H01L 23/36 165/168 |
| 2016/0014931 A1 * | 1/2016 | Hamakawa | H05K 7/20336 165/104.26 |
| 2017/0105315 A1 * | 4/2017 | Huang | F28F 21/06 |

FOREIGN PATENT DOCUMENTS

| | | | |
|---|---|---|---|
| CN | 106125872 A | * | 11/2016 |
| CN | 206075226 U | * | 4/2017 |
| EP | 3396801 A1 | * | 10/2018 |

OTHER PUBLICATIONS

"Sperry Unisys 1100/90 Computer", Chapter 7, Subchapter 7.3: Liquid Cooling, in Surface Mount and Related Technologies by Gerald L. Ginsberg, 1989, p. 135.

* cited by examiner

CONDUCTING PLASTIC COLD PLATES

BACKGROUND

This invention was made with Government support under Prime Contract No. DE-AC52-07NA27344 awarded by DOE. The Government has certain rights in this invention. Computing devices can utilize liquid cooling systems that can circulate a liquid, such as water, throughout the computing device to cool heat generating devices such as processors, memory resources, and/or other electrical components. Different components of the computing device can generate different quantities of heat. In some examples, components that provide a relatively higher performance can also generate a relatively greater quantity of heat. In some examples, computing devices can utilize relatively higher performing components within the same or similar footprint, which can generate a greater quantity of heat within the same or similar footprint.

DETAILED DESCRIPTION

Figure 1:
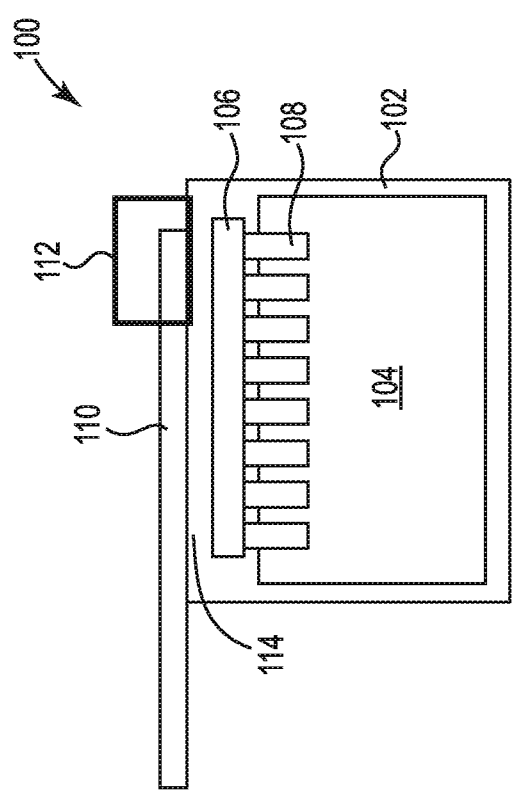
FIG. 1 illustrates an example device for a conductive plastic cold plate consistent with the present disclosure.

A cold plate can be a device that can be utilized to remove heat from a computing device or component of a computing device. For example, a cold plate can be a device that can be made of a conductive material that can transfer heat away from components of the computing device. In some examples, the cold plate can utilize liquid cooling resources such as water or coolant to transfer heat away from components of the computing device. For example, the cold plate can include a coolant channel that can transfer water or coolant across the components to remove heat from a surface of the components. In this example, the heat of the components can be transferred to the water or coolant and the coolant channel can move the water or coolant away from the components to a heat exchanger.

In some examples, the cold plate can be coupled to a printed circuit board (PCB) or printed circuit assembly (PCA) of the computing device. As used herein, a PCB or PCA can include a device that can mechanically support and/or electrically connect the components of a computing device. In some examples, a PCB or PCA can utilize a plurality of conductive tracks, pads, and/or other features etched from one or more sheet layers of a conductive substrate like copper laminated onto and/or between sheet layers of a non-conductive substrate. In some examples, the cold plate can be coupled to a main PCB or motherboard of the computing device.

In some examples, the cold plate can be positioned over a PCB of the computing device. In some examples, the coolant channels of the cold plate can be routed over a plurality of different components of the computing device. For example, a coolant channel of the cold plate can be routed over a central processing unit (CPU) of the computing device. In some examples, the cold plate can include coolant channels that include an embedded heat spreader (e.g., embedded heat plate, embedded metallic heat spreader, etc.). In some examples, the embedded heat spreader can be utilized to transfer heat from an exterior area of the coolant channel into the water or coolant within the coolant channel.

A number of systems and devices for cold plates are described herein. In some examples, a cold plate can include a thermally conductive plastic forming a coolant channel that includes a heat spreader formed into the thermally conductive plastic and an exterior surface of the thermally conductive plastic with a coupling location to couple a heat pipe to the exterior surface of the thermally conductive plastic. In some examples, the heat pipe may not be able to be embedded within the thermally conductive plastic without damaging the heat pipe. For example, the heat pipe can be a flat heat pipe that may not be able to withstand a pressure during injection molding of the thermally conductive plastic.

In some examples, the cold plates described herein can comprise a thermally conductive plastic material to transfer heat through the thermally conductive plastic. The cold plates described herein can be utilized to mount or bond heat pipes to an exterior surface of the cold plate to transfer heat provided by the heat pipes into the coolant channel such that a liquid within the coolant channel can remove heat from the heat pipes. In this way, the cold plates described herein can be utilized with a plurality of flat heat pipes positioned between dual in line memory module (DIMM) sockets to remove heat from DIMMs positioned within the sockets and remove the heat through the cold plate and/or coolant channel of the cold plate.

The figures herein follow a numbering convention in which the first digit corresponds to the drawing figure number and the remaining digits identify an element or component in the drawing. Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure and should not be taken in a limiting sense.

FIG. 1 illustrates an example system 100 for a conductive plastic cold plate 102 consistent with the present disclosure. In some examples, the conductive plastic cold plate 102 can include a coolant channel 104 that can be utilized to transport a liquid such as water or coolant. In some examples, the coolant channel 104 can be utilized to remove heat from a surface of heat generating devices and/or computing components of a computing device.

As used herein, a coolant channel 104 can include a liquid sealed area that can transport a liquid from a first location to a second location. For example, the coolant channel 104 can be coupled on a first end to an input manifold to receive a liquid from a heat exchanger and coupled on a second end to an output manifold to provide the liquid back to the heat exchanger. As used herein, a heat exchanger can be a device that can lower a temperature of a liquid or transfer heat from a liquid to a gas. For example, the heat exchanger can include a coil that can receive the liquid and air can be passed through the coil to remove heat from the liquid within the coil. In this example, the coil of the heat exchanger can be utilized to transfer heat from the liquid to the air that is passing through the coil.

As described herein, the coolant channel 104 can be utilized to remove heat from computing components that are coupled to a PCB of a computing device. In some examples, the coolant channel 104 can be surrounded by a thermally conductive plastic material of the cold plate 102. In this way, the thermally conductive plastic material can transfer heat from the computing components into the liquid of the coolant channel 104. For example, thermally conductive cold plate 102 can be positioned over a processing resource such as a CPU to transfer heat from the processing resource to the liquid of the coolant channel 104.

In some examples, the cold plate 102 can be positioned on or over the processing resource and the heat generated by the processing resource can be transferred by thermally conductive plastic material into the liquid of the coolant channel 104. In some examples, the cold plate 102 can be positioned above a component or heat generating device of the computing device. For example, the component or heat generating device can be positioned below the cold plate 102 as illustrated in FIG. 1. In this example, the heat generated by the component can be transferred through a bottom portion of the cold plate 102 via the thermally conductive plastic material to the liquid of the coolant channel 104.

In some examples, the cold plate 102 can include a heat spreader 106. In some examples, the heat spreader 106 can be coupled to the cold plate 102 to transfer heat from an exterior source to the liquid of the coolant channel 104. In some examples, the heat spreader 106 can be thermally conductive material. As used herein, a thermally conductive material can include a material that can transfer heat from a first location to a second location. In some examples, the heat spreader 106 can be made of a material that has a relatively high thermal conductivity. As used herein, thermal conductivity is a property of a material to conduct heat. Heat transfer occurs at a lower rate in materials that have a relatively low thermal conductivity and heat transfer occurs at a higher rate in materials that have a relatively high thermal conductivity.

In some examples, the heat spreader 106 can have a relatively higher thermal conductivity compared to the conductive plastic cold plate 102. That is, even though the conductive plastic cold plate 102 is made of a thermally conductive plastic material, the heat spreader 106 can be made of a material that has a relatively higher thermal conductivity compared to the thermally conductive plastic material of the cold plate 102. For example, the heat spreader 106 can transfer heat from a first location to a second location faster than the thermally conductive plastic material of the cold plate 102.

In some examples, the heat spreader 106 can be made of a metallic material such as copper, aluminum, or gold. In some examples, the heat spreader 106 can be molded into the cold plate 102. For example, the cold plate 102 can be manufactured utilizing a molding technique such as injection molding. In this example, the heat spreader 106 can be molded into the conductive plastic of the cold plate 102. That is, in this example, the heat spreader 106 can be surrounded by a thermally conductive plastic material of the cold plate 102. In some example, the heat spreader 106 can be made of a metallic material or relatively strong material that can withstand the relatively high pressures when molding the cold plate 102 out of a thermally conductive plastic material. In other examples, the cold plate 102 can be manufactured through an additive material process such as three dimensional printing utilizing a thermally conductive plastic material.

In some examples, the heat spreader 106 can include a plurality of fins 108. In some examples, the plurality of fins 108 can be coupled to a surface of the heat spreader 106. For example, the plurality of fins 108 can be soldered or attached to a surface of the heat spreader 106. In some examples, the heat spreader 106 can include a plurality of fins 108 that formed from the heat spreader 106. For example, the heat spreader 106 and the plurality of fins 108 can be formed of the same material.

In some examples, the plurality of fins 108 can extend from the surface of the heat spreader 106 into the coolant channel 104. In some examples, the plurality of fins 108 can be positioned within the coolant channel 104 to transfer heat from the heat spreader 106 into the liquid within the coolant channel 104. In some examples, the plurality of fins 108 can be ribs or tubular heat pipes to transfer the heat from the heat spreader 106 into the liquid within the coolant channel 104. In some examples, the tubular heat pipes can include heat pipes that are able to be molded into the thermally conductive plastic material of the cold plate 102.

In some examples, the system 100 can include a heat pipe 110 that is coupled to an exterior surface of the cold plate 102 at a coupling location 114. In some examples, the heat pipe 110 can be a heat pipe that utilizes heat conduction and phase change to transfer heat from a first location to a second location. For example, the heat pipe 110 can include a liquid material enclosed by a conductive material. The liquid material can be converted to a gas at a particular temperature. In this example, a heat generating device or component of the computing device can exceed the particular temperature and covert the liquid to a gas within the conductive material of the heat pipe 110. In this example, the gas produced within the heat pipe can travel within the heat pipe 110 toward the cold plate 102. In this example, the heat can be removed through the coupling location 114, to the heat spreader 106, through the plurality of fins 108, and transferred into the liquid within the coolant channel 104. In this way, heat can be removed from a remote component and transferred into the liquid of the coolant channel 104.

In some examples, the heat pipe 110 can be a heat pipe that is not capable of being molded into the thermally conductive plastic of the cold plate 102. For example, a molding process can generate a particular quantity of pressure during the molding process that can damage the heat pipe 110. For example, the heat pipe 110 can be a flat heat pipe that can be damaged under the pressures of molding a thermally conductive plastic into the cold plate 102 structure. As used herein, a flat heat pipe can be a heat pipe with a first flat side and a second flat side. This can differ from tubular heat pipes, which can be cylindrical in shape. The shape of the flat heat pipe can prevent a flat heat pipe such as heat pipe 110 from being molded into the thermally conductive plastic material of the cold plate 102. However, in some examples, a tubular or cylindrical heat pipe can have a shape that allows the tubular heat pipe to be molded into the thermally conductive plastic material of the cold plate 102.

In some examples, the system 100 can include a heat pipe support 112 coupled to the coupling location 114 of the cold plate 102. In some examples, the heat pipe support 112 can include a coupling mechanism that can receive a plurality of heat pipes including heat pipe 110. In some examples, the heat pipe support 112 can be utilized to align a plurality of heat pipes including the heat pipe 110 such that each of the plurality of heat pipes are spaced evenly across the coupling location 114 of the cold plate 102. In some examples, the heat pipe support 112 can include a cover that can apply a force on the heat pipe 110. In some examples, the force applied by the cover of the heat pipe support 112 can be utilized to maintain a physical contact between the heat pipe 110 and the exterior surface of the cold plate 102. In some examples, the heat pipe 110 can be soldered to the heat pipe support 112 or a support plate that is coupled to an exposed portion of the heat spreader and/or coupled to the cold plate 102.

The system 100 can include a cold plate 102 that is made of a thermally conductive plastic material. Utilizing thermally conductive plastic can reduce the overall weight of the cold plate 102. For example, the thermally conductive plastic can be relatively lighter than other conductive materials such as aluminum or copper. The cold plate 102 can include a coupling location 114 that can be utilized to couple a heat pipe 110 to the exterior surface of the cold plate 102. In this way, the heat pipe 110 can transfer heat from other components of a computing device to the liquid within the coolant channel 104 of the cold plate 102.

Figure 2:
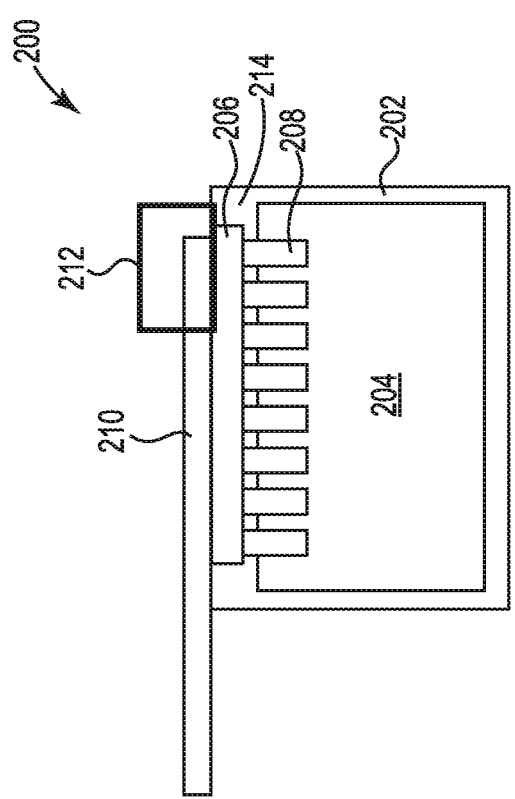
FIG. 2 illustrates an example device for a conductive plastic cold plate consistent with the present disclosure.

FIG. 2 illustrates an example system 200 for a conductive plastic cold plate 202 consistent with the present disclosure. The system 200 can include the same or similar elements as system 100 as referenced in FIG. 1. For example, the system 200 can include a cold plate 202 that is made of thermally conductive plastic material that forms a coolant channel 204 within the cold plate 202.

In some examples, the conductive plastic cold plate 202 can include a coolant channel 204 that can be utilized to transport a liquid such as water or coolant. In some examples, the coolant channel 204 can be utilized to remove heat from a surface of heat generating devices and/or computing components of a computing device.

As used herein, a coolant channel 204 can include a liquid sealed area that can transport a liquid from a first location to a second location. For example, the coolant channel 204 can be coupled on a first end to an input manifold to receive a liquid from a heat exchanger and coupled on a second end to an output manifold to provide the liquid back to the heat exchanger. In some examples, a liquid pump can be utilized to circulate the liquid or coolant within the coolant channel 204. As used herein, a heat exchanger can be a device that can lower a temperature of a liquid or transfer heat from a liquid to a gas.

As described herein, the coolant channel 204 can be utilized to remove heat from computing components that are coupled to a PCB of a computing device. In some examples, the coolant channel 204 can be surrounded by a thermally conductive plastic material of the cold plate 202. In this way, the thermally conductive plastic material can transfer heat from the computing components into the liquid of the coolant channel 204. For example, thermally conductive cold plate 202 can be positioned over a processing resource such as a CPU to transfer heat from the processing resource to the liquid of the coolant channel 204.

In some examples, the cold plate 202 can be positioned on or over the processing resource and the heat generated by the processing resource can be transferred by the thermally conductive plastic material into the liquid of the coolant channel 204. In some examples, the cold plate 202 can include a heat spreader 206. In some examples, the heat spreader 206 an be coupled to the cold plate 202 to transfer heat from an exterior source to the liquid of the coolant channel 204. In some examples, the heat spreader 206 can be thermally conductive material. As used herein, a thermally conductive material can include a material that can transfer heat from a first location to a second location. In some examples, the heat spreader 206 can be made of a material that has a relatively high thermal conductivity.

In some examples, the heat spreader 206 can have a relatively higher thermal conductivity compared to the conductive plastic cold plate 202. That is, even though the conductive plastic cold plate 202 is made of a thermally conductive plastic material, the heat spreader 206 can be made of a material that has a relatively higher thermal conductivity compared to the thermally conductive plastic material of the cold plate 202. For example, the heat spreader 206 can transfer heat from a first location to a second location faster than the thermally conductive plastic material of the cold plate 202.

In some examples, the heat spreader 206 can be made of a metallic material such as copper, aluminum, or gold. In some examples, the heat spreader 206 can be molded into the cold plate 202 such that the heat spreader 206 is exposed to an exterior area of the cold plate 202. For example, the cold plate 202 can be manufactured utilizing a molding technique such as injection molding. In this example, the heat spreader 206 can be molded into the conductive plastic of the cold plate 202 to couple the heat spreader 206 to the cold plate 202 and expose a surface of the heat spreader 206. In some examples, the exposed surface of the heat spreader 206 can be a coupling location 214 that can be utilized to couple a heat pipe 210

In some example, the heat spreader 206 can be made of a metallic material or relatively strong material that can withstand the relatively high pressures when molding the cold plate 202 out of a thermally conductive plastic material. In other examples, the cold plate 202 can be manufactured through an additive material process such as three dimensional printing utilizing a thermally conductive plastic material.

In some examples, the heat spreader 206 can include a plurality of fins 208. In some examples, the plurality of fins 208 can be coupled to a surface of the heat spreader 206 that is opposite to the surface of the heat spreader 206 utilized as a coupling location 214. For example, the plurality of fins 208 can be soldered or attached to a surface of the heat spreader 206. In some examples, the heat spreader 206 can include a plurality of fins 208 that are formed from the heat spreader 206. For example, the heat spreader 206 and the plurality of fins 208 can be formed of the same material.

In some examples, the plurality of fins 208 can extend from the surface of the heat spreader 206 into the coolant channel 204. In some examples, the plurality of fins 208 can be positioned within the coolant channel 204 to transfer heat from the heat spreader 206 into the liquid within the coolant channel 204. In some examples, the plurality of fins 208 can be ribs or tubular heat pipes to transfer the heat from the heat spreader 206 into the liquid within the coolant channel 204. In some examples, the tubular heat pipes can include heat pipes that are able to be molded into the thermally conductive plastic material of the cold plate 202. For example, the tubular heat pipes can include a cylindrical shape that can withstand a pressure during the molding process of thermally conductive plastics.

In some examples, the system 200 can include a heat pipe 210 that is coupled to a surface of the heat spreader 206 at a coupling location 214. For example, the heat pipe 210 can be bonded or coupled directly to the surface of the heat spreader 206 that is exposed from the cold plate 202. In some examples, the heat pipe 210 can be a heat pipe that utilizes heat conduction and phase change to transfer heat from a first location to a second location. In this way, heat can be removed from a remote component and transferred into the liquid of the coolant channel 204 via the heat spreader 206 and/or plurality of fins 208.

In some examples, the heat pipe 210 can be a heat pipe that is not capable of being molded into the thermally conductive plastic of the cold plate 202. For example, a molding process can generate a particular quantity of pressure during the molding process that can damage the heat pipe 210. For example, the heat pipe 210 can be a flat heat pipe that can be damaged under the pressures of molding a thermally conductive plastic into the cold plate 202 structure. As used herein, a flat heat pipe can be a heat pipe with a first flat side and a second flat side. This can differ from tubular heat pipes, which can be cylindrical in shape. The shape of the flat heat pipe can prevent a flat heat pipe such as heat pipe 210 from being molded into the thermally conductive plastic material of the cold plate 202. However, in some examples, a tubular or cylindrical heat pipe can have a shape that allows the tubular heat pipe to be molded into the thermally conductive plastic material of the cold plate 202.

In some examples, the system 200 can include a heat pipe support 212 coupled to the coupling location 214 of the heat spreader 206. In some examples, the heat pipe support 212 can include a coupling mechanism that can receive a plurality of heat pipes including heat pipe 210. In some examples, the heat pipe support 212 can be utilized to align a plurality of heat pipes including the heat pipe 210 such that each of the plurality of heat pipes are spaced evenly across the coupling location 214 of the cold plate 202. In some examples, the heat pipe support 212 can include a cover that can apply a force on the heat pipe 210. In some examples, the force applied by the cover of the heat pipe support 212 can be utilized to maintain a physical contact between the heat pipe 210 and the exterior surface heat spreader 206.

The system 200 can include a cold plate 202 that is made of a thermally conductive plastic material. Utilizing thermally conductive plastic can reduce the overall weight of the cold plate 202. For example, the thermally conductive plastic can be relatively lighter than other conductive materials such as aluminum or copper. The cold plate 202 can include a coupling location 214 that can be utilized to couple the heat pipe 210 directly to the surface of the heat spreader 206. In this way, the heat pipe 210 can transfer heat from other components of a computing device to the liquid within the coolant channel 204 of the cold plate 202 without being molded into the thermally conductive plastic of the cold plate 202.

Figure 3:
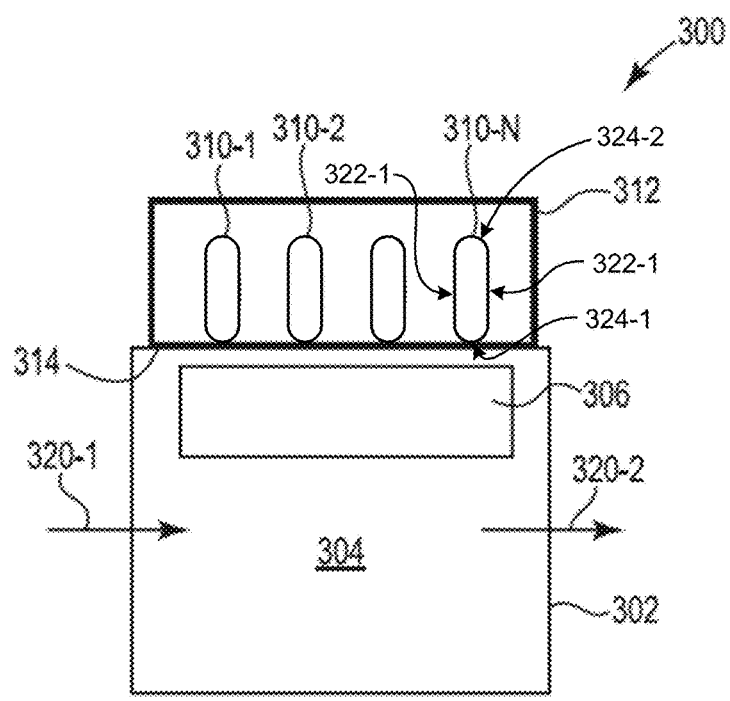
FIG. 3 illustrates an example device for a conductive plastic cold plate consistent with the present disclosure.

FIG. 3 illustrates an example system 300 for a conductive plastic cold plate 302 consistent with the present disclosure. The system 300 can include the same or similar elements as system 100 as referenced in FIG. 1 and/or system 200 as referenced in FIG. 2. For example, the system 300 can include a cold plate 302 that is made of thermally conductive plastic material that forms a coolant channel 304 within the cold plate 302. The system 300 can be a representation of a side view of system 100 as referenced in FIG. 1 and/or system 200 as referenced in FIG. 2.

In some examples, the conductive plastic cold plate 302 can include a coolant channel 304 that can be utilized to transport a liquid such as water or coolant. In some examples, the coolant channel 304 can be utilized to remove heat from a surface of heat generating devices and/or computing components of a computing device. In some examples, the coolant channel 304 can be coupled to a liquid pump that can move the liquid within the coolant channel 304 to move from arrow 320-1 toward arrow 320-2. That is, the liquid or coolant within the coolant channel 304 can move from the left side of the coolant channel 304 to a right side of the coolant channel 304, as illustrated in FIG. 3.

As used herein, a coolant channel 304 can include a liquid sealed area that can transport a liquid from a first location (e.g., left side of coolant channel 304) to a second location (e.g., right side of coolant channel 304). For example, the coolant channel 304 can be coupled on a first end as illustrated by arrow 320-1 to an input manifold to receive a liquid from a heat exchanger and coupled on a second end illustrated by arrow 320-2 to an output manifold to provide the liquid back to the heat exchanger. In some examples, a liquid pump can be utilized to circulate the liquid or coolant within the coolant channel 304. As used herein, a heat exchanger can be a device that can lower a temperature of a liquid or transfer heat from a liquid to a gas.

As described herein, the coolant channel 304 can be utilized to remove heat from computing components that are coupled to a PCB of a computing device. In some examples, the coolant channel 304 can be surrounded by a thermally conductive plastic material of the cold plate 302. In this way, the thermally conductive plastic material can transfer heat from the computing components into the liquid of the coolant channel 304. For example, thermally conductive cold plate 302 can be positioned over a processing resource such as a CPU to transfer heat from the processing resource to the liquid of the coolant channel 304.

In some examples, the cold plate 302 can be positioned on or over the processing resource and the heat generated by the processing resource can be transferred by the thermally conductive plastic material into the liquid of the coolant channel 304. In some examples, the cold plate 302 can include a heat spreader 306. In some examples, the heat spreader 306 can be coupled to the cold plate 302 to transfer heat from an exterior source to the liquid of the coolant channel 304. In some examples, the heat spreader 306 can be thermally conductive material. As used herein, a thermally conductive material can include a material that can transfer heat from a first location to a second location. In some examples, the heat spreader 306 can be made of a material that has a relatively high thermal conductivity.

In some examples, the heat spreader 306 can have a relatively higher thermal conductivity compared to the conductive plastic cold plate 302. That is, even though the conductive plastic cold plate 302 is made of a thermally conductive plastic material, the heat spreader 306 can be made of a material that has a relatively higher thermal conductivity compared to the thermally conductive plastic material of the cold plate 302. For example, the heat spreader 306 can transfer heat from a first location to a second location faster than the thermally conductive plastic material of the cold plate 302.

In some examples, the system 300 can include a plurality of heat pipes 310-1, 310-2, 310-N that are coupled to an exterior surface of the cold plate 302 and/or coupled directly to a surface of the heat spreader 306 at a coupling location 314. For example, the plurality of heat pipes 310-1, 310-2, 310-N can be bonded or coupled directly to an exterior surface of the cold plate 302 and/or coupled directly to the surface of the heat spreader 306 that is exposed from the cold plate 302. In some examples, the plurality of heat pipes 310-1, 310-2, 310-N can be heat pipes that utilize heat conduction and phase change to transfer heat from a first location to a second location. In this way, heat can be removed from a remote component and transferred into the liquid of the coolant channel 304 via the heat spreader 306.

In some examples, the plurality of heat pipes 310-1, 310-2, 310-N can be heat pipes that are not capable of being molded into the thermally conductive plastic of the cold plate 302. For example, a molding process can generate a particular quantity of pressure during the molding process that can damage the plurality of heat pipes 310-1, 310-2, 310-N. For example, the plurality of heat pipes 310-1, 310-2, 310-N can be flat heat pipes that can be damaged under the pressures of molding a thermally conductive plastic into the cold plate 302 structure.

As used herein, a flat heat pipe can be a heat pipe with a first flat side 322-1 and a second flat side 322-2. In some examples, the first flat side 322-1 and the second flat side 322-2 can be coupled together and sealed by a first round side 324-1 and a second round side 324-2. In some examples, the first round side 324-1 and the second round side 324-2 can be a non-flat portion of the heat pipe. In some examples, the first round side 324-1 and the second round side 324-2 can be a relatively rounded edge to remove sharp edges at the corners of the heat pipe. This can differ from tubular heat pipes, which can be cylindrical in shape. The shape of the flat heat pipe can prevent a flat heat pipe such as the plurality of heat pipes 310-1, 310-2, 310-N from being molded into the thermally conductive plastic material of the cold plate 302. However, in some examples, a tubular or cylindrical heat pipe can have a shape that allows the tubular heat pipe to be molded into the thermally conductive plastic material of the cold plate 302.

In some examples, the system 300 can include a heat pipe support 312 coupled to the coupling location 314 of the exterior surface of the cold plate 302. In some examples, the heat pipe support 312 can include a coupling mechanism that can receive a plurality of heat pipes 310-1, 310-2, 310-N. In some examples, the heat pipe support 312 can be utilized to align a plurality of heat pipes 310-1, 310-2, 310-N such that each of the plurality of heat pipes 310-1, 310-2, 310-N are spaced evenly across the coupling location 314 of the cold plate 302. In some examples, the heat pipe support 312 can include a cover 326 that can apply a force on the plurality of heat pipes 310-1, 310-2, 310-N. In some examples, the force applied by the cover 326 of the heat pipe support 312 can be utilized to maintain a physical contact between the plurality of heat pipes 310-1, 310-2, 310-N and the exterior surface of the cold plate 302.

In some examples, heat pipe support 312 can be utilized to couple the second round side 324-2 of the plurality of heat pipes 310-1, 310-2, 310-N to the coupling location 314 on the exterior surface of the cold plate 302. In some examples, the second round side 324-2 can be difficult to couple to a relatively flat surface of the coupling location 314 of the cold plate 302. In some examples, the heat pipe support 312 can be utilized to prevent the plurality of heat pipes 310-1, 310-2, 310-N from moving or tipping to the first flat side 322-1 or second flat side 322-2. In some examples, the second round side 324-2 can be in physical contact with the surface of the cold plate 302 with the applied force of the cover 326 of the heat pipe support 312. In addition, the heat pipe support 312 can include a plurality of apertures to receive each of the plurality of heat pipes 310-1, 310-2, 310-N to prevent the applied force from the cover 326 of the heat pipe support 312 from altering a position of the plurality of heat pipes 310-1, 310-2, 310-N. For example, the applied force from the cover of the heat pipe support 312 could tip one or more of the plurality of heat pipes 310-1, 310-2, 310-N to a flat side 322-1, 322-2, which can alter a position of the plurality of heat pipes 310-1, 310-2, 310-N with respect to a plurality of dual in line memory module (DIMM) sockets, which will be discussed further with reference to FIG. 4.

In some examples, the plurality of heat pipes 310-1, 310-2, 310-N can be aligned in a first direction and the flow of the coolant channel 304 can be in a second direction. In some examples, the plurality of heat pipes 310-1, 310-2, 310-N can be aligned by the heat pipe support 312 in a direction that is perpendicular to the flow of the coolant channel 304. For example, the plurality of heat pipes 310-1, 310-2, 310-N can be aligned into the page of FIG. 3 and the flow of the coolant channel illustrated by arrows 320-1, 320-2 can move from the left side to the right side as illustrated in FIG. 3.

The system 300 can include a cold plate 302 that is made of a thermally conductive plastic material. Utilizing thermally conductive plastic can reduce the overall weight of the cold plate 302. For example, the thermally conductive plastic can be relatively lighter than other conductive materials such as aluminum or copper. The cold plate 302 can include a coupling location 314 that can be utilized to couple a round side 324-1, 324-2 of the plurality of heat pipes 310-1, 310-2, 310-N directly to the surface of the cold plate 302. In this way, the plurality of heat pipes 310-1, 310-2, 310-N can transfer heat from other components of a computing device to the liquid within the coolant channel 304 of the cold plate 302 without being molded into the thermally conductive plastic of the cold plate 302.

Figure 4:
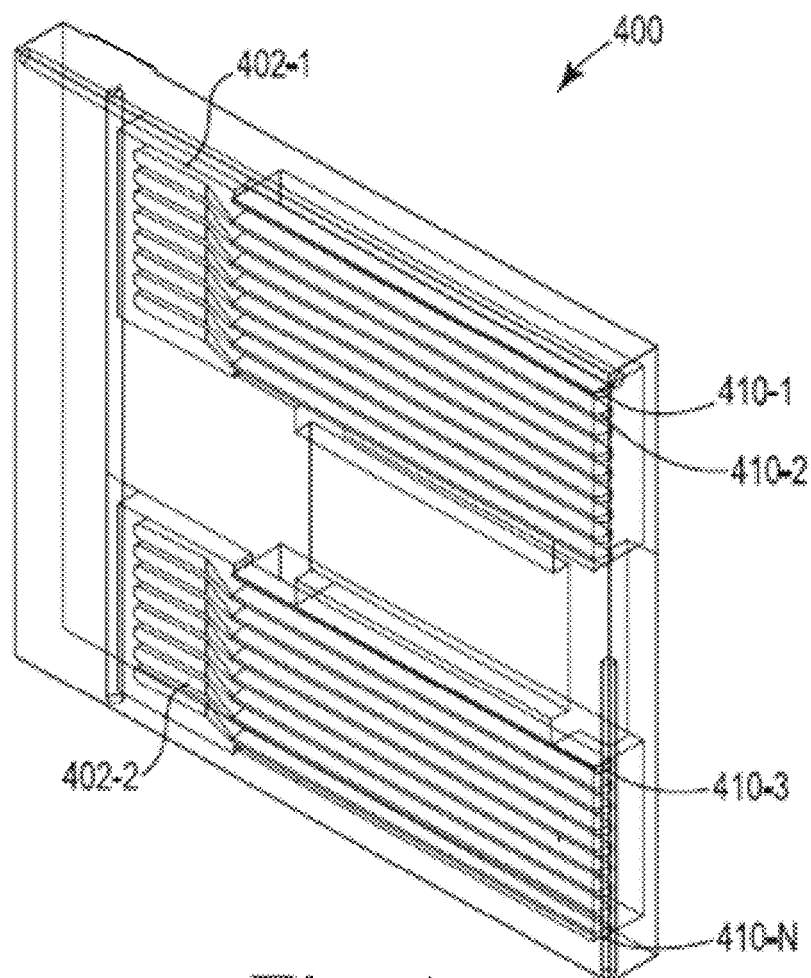
FIG. 4 illustrates an example system for a conductive plastic cold plate consistent with the present disclosure.

FIG. 4 illustrates an example system 400 for a conductive plastic cold plate 402 consistent with the present disclosure. In some examples, the system 400 can include the same or similar elements as system 100 as referenced in FIG. 1, system 200 as referenced in FIG. 2, and/or system 300 as referenced in FIG. 3. For example, the system 400 can include a plurality of heat pipes 410-1, 410-2, 410-N coupled to a first cold plate 402-1 and/or a second cold plate 402-2.

As described herein, the plurality of heat pipes 410-1, 410-2, 410-N can be positioned between a plurality of corresponding DIMM sockets to remove heat from a plurality of DIMMs coupled to the plurality of corresponding DIMM sockets. In this way, the plurality of heat pipes 410-1, 410-2, 410-N can remove heat generated by the plurality of DIMMs coupled to the plurality of corresponding DIMM sockets. In some examples, the plurality of heat pipes 410-1, 410-2, 410-N can transfer the heat generated by the plurality of DIMMS to a corresponding cold plate 402-1, 402-2 as described herein.

In some examples, the heat pipes 410-1, 410-2 can be positioned on either side of a DIMM slot to remove heat from a DIMM positioned within the DIMM slot. In these examples, the heat pipes 410-1, 410-2 can be utilized to transfer heat from the DIMM within the DIMM slot to the cold plate 402-1. In some examples, the heat pipes 410-3, 410-N can be positioned on either side of a DIMM slot to remove heat from a DIMM positioned within the DIMM slot. In these examples, the heat pipes 410-3, 410-N can be utilized to transfer heat from the DIMMs within corresponding DIMM slots to the cold plate 402-2.

In some examples, the cold plates 402-1, 402-2 can include a coolant channel (e.g., coolant channel 104 as referenced in FIG. 1, etc.) that can provide a liquid that can remove heat from a heat spreader that is removing heat from the heat pipes 410-1, 410-2, 410-3, 410-N. For example, heat pipes 410-1, 410-2 can transfer heat generated by a plurality of DIMMs to the cold plate 402-1. In this example, the cold plate 402-1 can include a heat spreader (e.g., heat spreader 106 as referenced in FIG. 1) that can transfer heat from the heat pipe 410-1 into a coolant channel.

In some examples, the coolant channel can be utilized to transfer heat from the cold plates 402-1, 402-2 to a heat exchanger or liquid chiller. As described herein, the cold plates 402-1, 402-2 can include corresponding heat spreaders that can be utilized to transfer heat from the plurality of heat pipes 410-1, 410-2, 410-N into a liquid within the coolant channels of the cold plates 402-1, 402-2. In this way, the cold plates 402-1, 402-2 can be utilized to remove heat from a plurality of DIMMs positioned within a plurality of DIMM sockets.

The system 400 can include a plurality of cold plates 402-1, 402-2 that are made of a thermally conductive plastic material. Utilizing thermally conductive plastic can reduce the overall weight of the cold plates 402-1, 402-2. For example, the thermally conductive plastic can be relatively lighter than other conductive materials such as aluminum or copper. The cold plates 402-1, 402-2 can include a coupling location that can be utilized to couple a round side of the plurality of heat pipes 410-1, 410-2, 410-3, 410-N directly to the surface of a corresponding cold plate 402-1, 402-2. In this way, the plurality of heat pipes 410-1, 410-2, 410-3, 410-N can transfer heat from the plurality of DIMMs to a liquid within a coolant channel of the cold plates 402-1, 402-2 without being molded into the thermally conductive plastic of the cold plates 402-1, 402-2.

Figure 5:
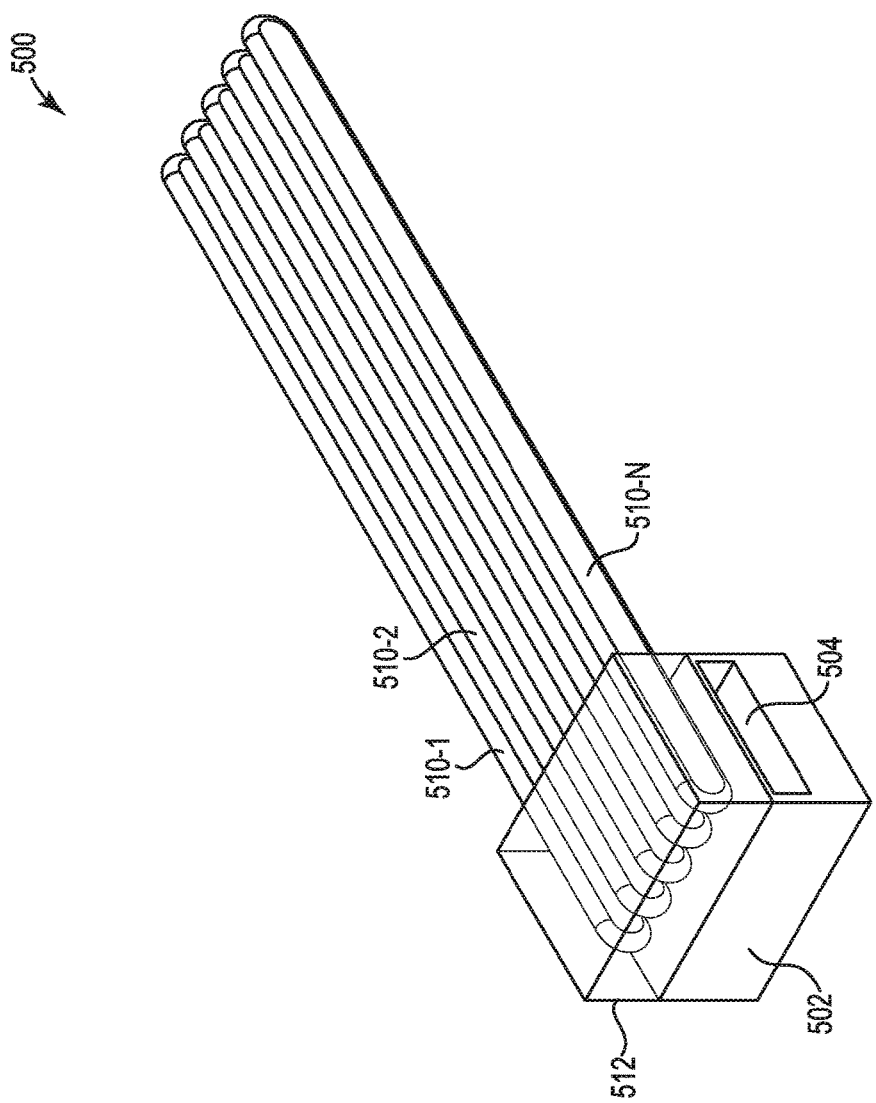
FIG. 5 illustrates an example system for a conductive plastic cold plate consistent with the present disclosure.

FIG. 5 illustrates an example system 500 for a conductive plastic cold plate 502 consistent with the present disclosure. In some examples, the system 500 can include the same or similar elements as system 100 as referenced in FIG. 1, system 200 as referenced in FIG. 2, system 300 as referenced in FIG. 3, and/or system 400 as referenced in FIG. 4. For example, the system 500 can include a plurality of heat pipes 510-1, 510-2, 510-N coupled to a cold plate 502 by a heat pipe support 512. As described herein, the conductive plastic cold plate 502 can comprise a conductive plastic material that can form a coolant channel 504.

As described herein, the plurality of heat pipes 510-1, 510-2, 510-N can be positioned between a plurality of corresponding DIMM sockets to remove heat from a plurality of DIMMs coupled to the plurality of corresponding DIMM sockets. In this way, the plurality of heat pipes 510-1, 510-2, 510-N can remove heat generated by the plurality of DIMMs coupled to the plurality of corresponding DIMM sockets. In some examples, the plurality of heat pipes 510-1, 510-2, 510-N can transfer the heat generated by the plurality of DIMMS to the cold plate 502. In some examples, the heat transferred by the plurality of heat pipes 510-1, 510-2, 510-N to the cold plate 502 can be transferred from the cold plate 502 into a liquid within the coolant channel 504.

In some examples, the plurality of heat pipes 510-1, 510-2, 510-N can be positioned on either side of a DIMM slot to remove heat from a DIMM positioned within the DIMM slot. In these examples, the plurality of heat pipes 510-1, 510-2, 510-N can be utilized to transfer heat from the DI MM within the DIMM slot to the cold plate 502.

In some examples, the cold plate 502 can include a coolant channel 504 that can provide a liquid that can remove heat from a heat spreader that is removing heat from the plurality of heat pipes 510-1, 510-2, 510-N. For example, the plurality of heat pipes 510-1, 510-2, 510-N can transfer heat generated by a plurality of DIMMs to the cold plate 502. In this example, the cold plate 502 can include a heat spreader (e.g., heat spreader 106 as referenced in FIG. 1) that can transfer heat from the plurality of heat pipes 510-1, 510-2, 510-N into the coolant channel 504.

In some examples, the coolant channel 504 can be utilized to transfer heat from the cold plate 502 to a heat exchanger or liquid chiller. As described herein, the cold plate 502 can include a heat spreader that can be utilized to transfer heat from the plurality of heat pipes 510-1, 510-2, 510-N into a liquid within the coolant channel 504 of the cold plates 502. In this way, the cold plate 502 can be utilized to remove heat from a plurality of DIMMs positioned within a plurality of DI MM sockets.

In some examples, the heat pipe support 512 can be positioned on the cold plate 502 to couple the plurality of heat pipes 510-1, 510-2, 510-N to the cold plate 502. In some examples, the heat pipe support 512 can include a plurality of apertures to receive the plurality of heat pipes 510-1, 510-2, 510-N. For example, the heat pipe support 512 can comprise a material with a plurality of apertures machined out of the material. In this example, a portion of the plurality of heat pipes 510-1, 510-2, 510-N can be inserted into the plurality of apertures. In some examples, the material of the heat pipe support 512 can be a conductive material such as aluminum or copper. In some examples, the plurality of apertures can be shaped to receive a flat heat pipe as described herein such that a rounded portion of the plurality of heat pipes 510-1, 510-2, 510-N can be positioned toward a surface of the cold plate 502.

The system 500 can include a cold plate 502 that is made of a thermally conductive plastic material. Utilizing thermally conductive plastic can reduce the overall weight of the cold plate 502. For example, the thermally conductive plastic can be relatively lighter than other conductive materials such as aluminum or copper. The cold plate 502 can include a heat pipe support 512 that can be utilized to couple the plurality of heat pipes 510-1, 510-2, 510-N to the exterior surface of the cold plate 502. In this way, the plurality of heat pipes 510-1, 510-2, 510-N can transfer heat from other components of a computing device to the liquid within the coolant channel 504 of the cold plate 502.

Figure 6:
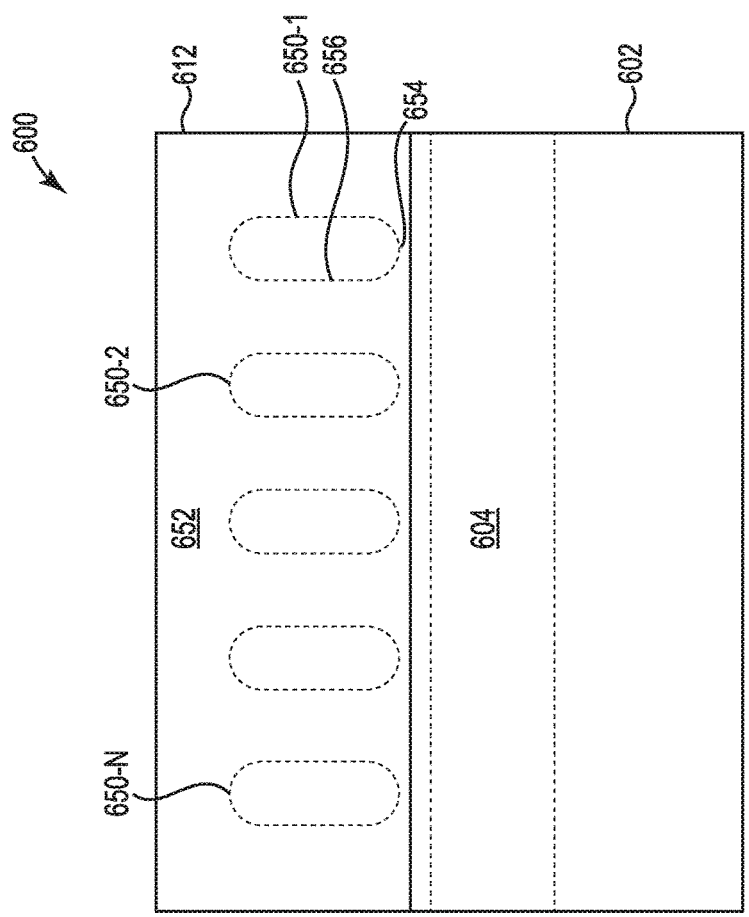
FIG. 6 illustrates an example system for a conductive plastic cold plate consistent with the present disclosure.

FIG. 6 illustrates an example system 600 for a conductive plastic cold plate 602 consistent with the present disclosure. In some examples, the system 500 can include the same or similar elements as system 100 as referenced in FIG. 1, system 200 as referenced in FIG. 2, system 300 as referenced in FIG. 3, system 400 as referenced in FIG. 4, and/or system 500 as referenced in FIG. 5. For example, the system 600 can include a heat pipe support 612 that includes a plurality of apertures 650-1, 650-2, 650-N that can receive a plurality of heat pipes and couple the plurality of heat pipes to a cold plate 602. As described herein, the conductive plastic cold plate 602 can comprise a conductive plastic material that can form a coolant channel 604.

In some examples, the liquid can flow through the coolant channel 604 to remove heat from a plurality of heat pipes coupled to the heat pipe support 612. For example, water can flow through the coolant channel 604 and remove heat from the area where the heat pipe support 612 is coupled to the cold plate 602. In some examples, the heat pipe support 612 can comprise a thermally conductive material 652. For example, the heat pipe support 612 can be made of aluminum to transfer heat from a plurality of heat pipes positioned within the plurality of apertures 650-1, 650-2, 650-N to the cold plate 602.

In some examples, plurality of apertures 650-1, 650-2, 650-N can be machined out of the heat pipe support 612 in a shape of a plurality of heat pipes. For example, the plurality of apertures 650-1, 650-2, 650-N can be shaped to receive a plurality of flat heat pipes as described herein. For example, a flat heat pipe can include two flat sides coupled by two round sides. In some examples, each of the plurality of apertures 650-1, 650-2, 650-N can include flat sides and round sides to receive a corresponding flat heat pipe. For example, the aperture 650-1 can include a flat side 656 to receive a corresponding flat side of a flat heat pipe and the aperture 650-1 can include a round side 654 to receive a corresponding round side of the flat heat pipe.

In some examples, the plurality of heat pipes can be soldered into the plurality of apertures 650-1, 650-2, 650-N to make a relatively more permanent coupling between the plurality of heat pipes and the heat pipe support 612. In some examples, an adhesive material can be utilized to couple a plurality of heat pipes within the plurality of apertures 650-1, 650-2, 650-N. In other examples, the plurality of apertures 650-1, 650-2, 650-N can include a locking mechanism that prevents a heat pipe from being removed from the plurality of apertures 650-1, 650-2, 650-N.

The above specification, examples and data provide a description of the methods and applications and use of the system and method of the present disclosure. Since many examples can be made without departing from the spirit and scope of the system and method of the present disclosure, this specification merely sets forth some of the many possible example configurations and implementations.

What is claimed:

1. A cold plate, comprising:
   a thermally conductive plastic forming a coolant channel that includes a heat spreader formed into the thermally conductive plastic;
   an exterior surface of the thermally conductive plastic with a coupling location to couple a flat heat pipe to the exterior surface of the thermally conductive plastic; and
   a plurality of fins extending from the heat spreader into the coolant channel.

2. The cold plate of claim 1, wherein the plurality of fins include a conductive material that is coupled to the heat spreader and extend into the coolant channel.

3. The cold plate of claim 1, comprising a heat pipe support structure coupled to the flat heat pipe at the coupling location.

4. The cold plate of claim 3, wherein the heat pipe support structure is positioned to maintain physical contact between the flat heat pipe and the exterior surface of the thermally conductive plastic.

5. The cold plate of claim 3, wherein the heat pipe support structure includes an aperture to receive the flat heat pipe.

6. The cold plate of claim 3, wherein the heat pipe support structure is coupled to the exterior surface of the thermally conductive plastic.

7. A computing device, comprising:
   the cold plate of claim 1.

8. The computing device of claim 7, wherein the cooling channel is perpendicular to the flat heat pipe coupled to the cold plate.

9. A cooling system, comprising:
   a plurality of flat heat pipes; and
   a cold plate comprising:
      a thermally conductive plastic to enclose a coolant channel;
      a heat spreader that is formed into the thermally conductive plastic such that a portion of the heat spreader is exposed to an exterior of the cold plate; and
      a coupling location on the exposed portion of the heat spreader to couple the plurality of flat heat pipes to the heat spreader.

10. The cooling system of claim 9, wherein the plurality of flat heat pipes are soldered to a support plate coupled to the exposed portion of the heat spreader.

11. The cooling system of claim 9, comprising a plurality of ribs coupled to the heat spreader.

12. The cooling system of claim 11, wherein the plurality of ribs extend from a non-exposed portion of the heat spreader to the coolant channel.

13. The cooling system of claim 9, wherein the coolant channel runs perpendicular to the plurality of flat heat pipes.

14. The cooling system of claim 9, wherein the plurality of flat heat pipes are coupled to the heat spreader on non-flat portions of the plurality of flat heat pipes.

* * * * *